(12) United States Patent
Marrow et al.

(10) Patent No.: US 8,756,473 B1
(45) Date of Patent: Jun. 17, 2014

(54) SOLID STATE DEVICE CODING ARCHITECTURE FOR CHIPKILL AND ENDURANCE IMPROVEMENT

(75) Inventors: Marcus Marrow, San Jose, CA (US); Rajiv Agarwal, Menlo Park, CA (US)

(73) Assignee: SK hynix memory solutions inc., San Jose, CA (US)

( * ) Notice: Subject to any disclaimer, the term of this patent is extended or adjusted under 35 U.S.C. 154(b) by 123 days.

(21) Appl. No.: 13/328,988

(22) Filed: Dec. 16, 2011
(Under 37 CFR 1.47)

Related U.S. Application Data

(60) Provisional application No. 61/426,963, filed on Dec. 23, 2010.

(51) Int. Cl.
*H03M 13/00* (2006.01)

(52) U.S. Cl.
USPC .......................................................... 714/753

(58) Field of Classification Search
USPC .......... 714/753, 785, 782, 784, 752, 755, 758
See application file for complete search history.

(56) References Cited

U.S. PATENT DOCUMENTS

| | | | |
|---|---|---|---|
| 7,904,780 B2* | 3/2011 | Brandman | 714/752 |
| 7,966,546 B2* | 6/2011 | Mokhlesi et al. | 714/773 |
| 8,261,170 B2* | 9/2012 | Yedidia et al. | 714/794 |
| 8,301,979 B2* | 10/2012 | Sharon et al. | 714/763 |
| 8,335,977 B2* | 12/2012 | Weingarten et al. | 714/794 |
| 2006/0015791 A1* | 1/2006 | Kikuchi et al. | 714/758 |
| 2007/0104300 A1* | 5/2007 | Esumi et al. | 375/346 |
| 2007/0124657 A1* | 5/2007 | Orio | 714/794 |
| 2007/0171714 A1* | 7/2007 | Wu et al. | 365/185.09 |
| 2007/0283214 A1* | 12/2007 | Lasser | 714/758 |
| 2008/0276156 A1 | 11/2008 | Gunnam et al. | |
| 2008/0301521 A1 | 12/2008 | Gunnam et al. | |
| 2009/0070656 A1* | 3/2009 | Jo et al. | 714/763 |
| 2009/0199069 A1* | 8/2009 | Palanki et al. | 714/755 |
| 2011/0004812 A1* | 1/2011 | Yang | 714/782 |
| 2011/0296280 A1* | 12/2011 | Achir et al. | 714/776 |

OTHER PUBLICATIONS

Park et al., "Reliability and Performance Enhancement Technique for SSD array storage system using RAID mechanism", ISCIT 2009, IEEE, 2009.
Blaum et al., "EVENODD: An Efficient Scheme for Tolerating Double Disk Failures in RAID Architectures", IEEE Transactions on Computers, Feb. 1995, vol. 44, No. 2.
Fossorier et al., "Reduced Complexity Iterative Decoding of Low-Density Parity Check Codes Based on Belief Propagation", IEEE Transactions on Communications, May 1999, vol. 47, No. 5.

* cited by examiner

*Primary Examiner* — Albert Decady
*Assistant Examiner* — Osman Alshack
(74) *Attorney, Agent, or Firm* — Van Pelt, Yi & James LLP

(57) ABSTRACT

A first decoder performs decoding on each data set in a first plurality of data sets using a first code; each data set in the first plurality is stored on a different NAND Flash chip. It is determined if the first decoding is successful; if not, a second decoder performs a second decoding on each data set in a second plurality of data sets using a second code; each data set in the second plurality includes at least some data, after the first decoding using the first code, from each data set in the first plurality. The first decoder performs a third decoding on each data set in the first plurality using the first code, where each data set in the first plurality includes at least some data, after the second decoding using the second code, from each data set in the second plurality.

22 Claims, 15 Drawing Sheets

Decode rows again using first error correction code

Pass

SOLID STATE DEVICE CODING ARCHITECTURE FOR CHIPKILL AND ENDURANCE IMPROVEMENT

CROSS REFERENCE TO OTHER APPLICATIONS

This application claims priority to U.S. Provisional Patent Application No. 61/426,963 entitled SSD CODING ARCHITECTURE FOR CHIPKILL AND ENDURANCE IMPROVEMENT filed Dec. 23, 2010 which is incorporated herein by reference for all purposes.

BACKGROUND OF THE INVENTION

NAND Flash storage systems sometimes include multiple NAND Flash. A NAND Flash chip, like any other semiconductor, may fail and this may be referred to as a "chipkill." To ensure that user data is able to be recovered even in the event of a chip failure, some systems manufacturers have performance requirements related to chipkill. One such solution which may be supported is a Redundant Array of Inexpensive Disks (RAID) type of solution. A NAND Flash storage system that supports RAID includes at least one additional NAND Flash chip. In one example, there are $N_p$ NAND Flash chips which are used to store user data, plus an additional NAND Flash chip (used in the event a chip fails) for a total of $N_p+1$ NAND Flash chips.

It would be desirable if additional error protection and/or recovery techniques could be provided, for example in combination with RAID support. For example, it may be desirable to improve the performance of a storage system when faced with random errors. It would also be desirable if such techniques did not require additional hardware (e.g., did not require additional NAND Flash chips beyond the exemplary $N_p+1$ NAND Flash chips).

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
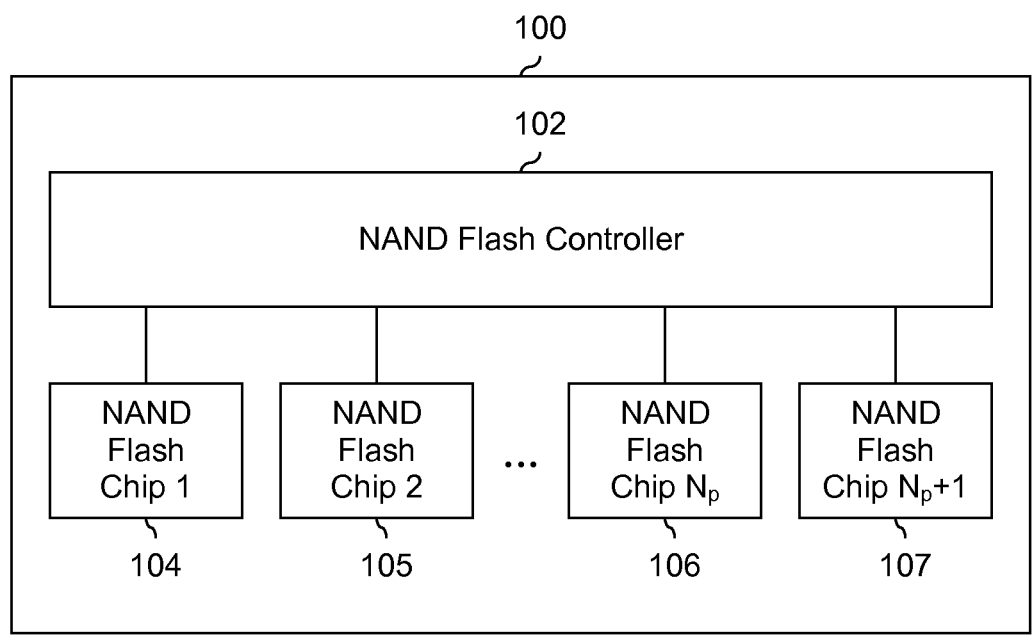
FIG. 1 is a diagram showing an embodiment of a NAND Flash storage system.

FIG. 1 is a diagram showing an embodiment of a NAND Flash storage system. In the example shown, printed circuit board (PCB) 100 includes NAND Flash controller 102 and NAND Flash chips 104-107. PCB 100 has a Redundant Array of Inexpensive Disks (RAID) type of chipkill protection such that $N_p$ of the NAND Flash chips (e.g., chips 104-106) are used to store user data and the $N_p+1^{th}$ chip (e.g., chip 107) is used in the event one of the other chips fails. Specifically, two error correction codes are used. The following figures show in more detail embodiments of NAND Flash controller 102 and how the two error correction codes are applied.

Figure 2:
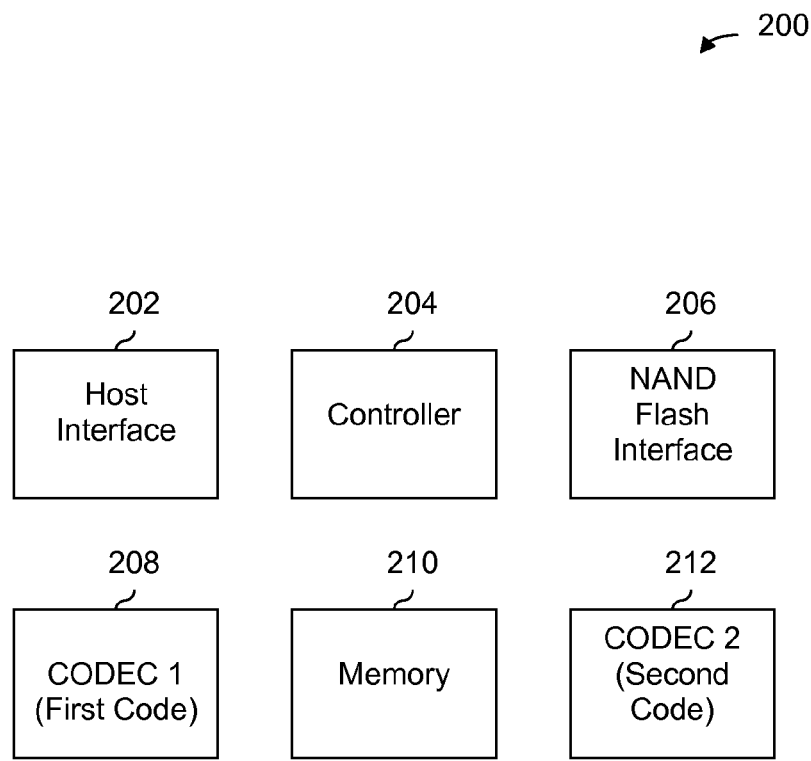
FIG. 2 is a diagram showing an embodiment of a NAND Flash controller.

FIG. 2 is a diagram showing an embodiment of a NAND Flash controller. In some embodiments, NAND Flash controller 102 in FIG. 1 is implemented as shown. In some embodiments, a NAND Flash controller is implemented in some other manner. NAND Flash controller 200 includes host interface 202. Host interface 202 receives instructions from and sends appropriate responses to an application which stores data in NAND Flash storage. For example, write/store instructions or read/access instructions may come from a word processing application or file system which stores data in NAND Flash memory and such instructions are received via host interface 202.

NAND Flash controller 200 includes controller 204 which responds to instructions received via host interface 202, including by using two error correction codes to store data in NAND Flash storage. Controller 204 uses NAND Flash interface 206 to communicate with one or more NAND Flash chips (e.g., NAND Flash chips 104-107 in FIG. 1). Two Coder-decoders (CODECs) 208 and 212 perform the encoding and decoding associated with a first and second error correction code, respectively. The operation of CODECs 208 and 212 is controlled by controller 204, for example depending upon the successful decoding using one or both of the error correction codes. Memory 210 is used by other components (e.g., controller 204, CODEC 208 and/or CODEC 212) to temporarily store data. For example, CODEC 208, in the process of encoding data using a first error correction code, may store some intermediate values in memory 210. In another example, controller 204 records state information or other variables in memory 210.

In various embodiments, NAND Flash controller 200 is implemented in a variety of ways. Some examples include an application-specific integrated circuit (ASIC), a field-programmable gate array (FPGA) and/or a processor (e.g., an embedded ARM processor).

Figure 3:
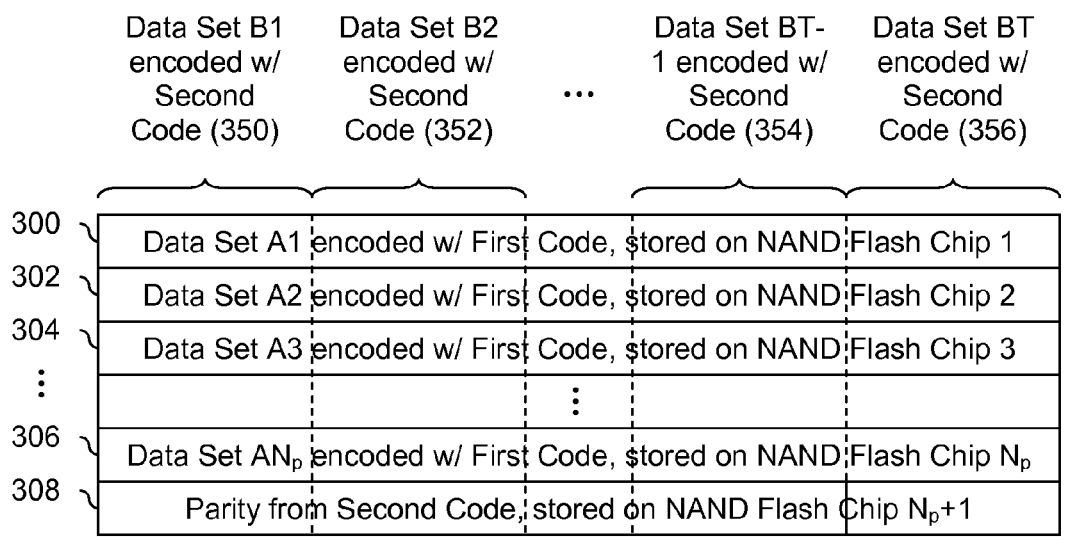
FIG. 3 is a diagram showing an embodiment of data from multiple NAND Flash chips encoded using two error correction codes.

FIG. 3 is a diagram showing an embodiment of data from multiple NAND Flash chips encoded using two error correction codes. In the example shown, the two-dimensional data array shown is merely conceptual to illustrate the technique and the data array shown may not necessarily be stored or assembled as such.

Rows 300-306 include a first plurality of data sets encoded using a first error correction code, where each encoded data set is stored on a different NAND Flash chip. For example, the encoded data set in row 300 is stored in a first NAND Flash chip (e.g., chip 104 in FIG. 1), the encoded data set in row 302 is stored in a second NAND Flash chip (e.g., chip 105 in FIG. 1) and so on. The data in the first $N_p$ rows (i.e., rows 300-306) are encoded using a first error correction code. Some example codes which may be used for the first error correction code include Bose Ray-Chaudhuri (BCH) codes and low-density parity-check (LDPC) codes. The $N_p+1^{th}$ row, (i.e., row 308) contains parity information associated with a second error correction code and (at least in this embodiment) does not include user data and is not encoded using the first error correction code.

In various embodiments, the data array shown has various dimensions. In some embodiments, each row (i.e., each A data set) has a size corresponding to a page of NAND Flash chip. In some embodiments, each column (i.e., each B data) has a size corresponding to a block. In this embodiment, the number of rows is related to the number of NAND Flash chips in a system or PCB. For example, if there are 33 total NAND Flash chips (e.g., 32 for user data and 1 extra for RAID support) then $N_p=32$ and there are 33 rows (i.e., $N_p+1$). In some case, $N_p$ is dictated by the solid state drive total capacity. For example, 256 GB solid state drive will usually have 32 8 GB NAND die. For a 512 GB solid state drive, $N_p=64$ may be used. In some embodiments, the cases or likelihood in which the technique described herein is used is quite rare so the highest rate CODEC 212 may be is preferred (e.g., because most of the time the system will be operating under normal conditions and under normal conditions the highest rate CODEC 212 may be preferred). In some embodiments, data is arranged or organized in some other manner than is shown here. For example, in an embodiment described in further detail below, a single row includes information stored on multiple NAND Flash chips.

In addition to the first error correction code, there is a second error correction code applied to the data shown. One example of a second error correction code is a Reed-Solomon code. A second plurality of data sets is arranged (at least conceptually) in columns and a second error correction code is applied to the B data sets (350-356). As shown in this example, each A data set includes at least some data from every B data set and vice versa. In this particular example there are a total of T data sets in the vertical direction. If each of the T sets of data is r symbols wide, then there are r×$N_p$ symbols per B data set onto which the second error correction code is applied. Application of the second error correction code results in parity information. This parity information associated with the second error correction code is stored in row 308 which corresponds to the $N_p+1^{th}$ chip (e.g., chip 107 in FIG. 1). For example, the first r symbols of row 308 correspond to parity information from data set 350, the second r symbols of row 308 correspond to parity information from data set 352 and so on.

In various applications, it is desirable for the first error correction code and/or the second error correction code to have certain properties. In some embodiments, it is desirable for the second error correction code to be a systematic code. A systematic code is one in which the input data is present in the encoded codeword. In one example, the encoded codeword is the original input data followed by some parity information. It may be desirable to use a systematic code since this enables data stored in rows 300-306 to be accessed without having to also perform error correction decoding using the second error correction code. To illustrate, suppose a non-systematic code is used and data in row 300 is desired. Even though only row 300 is desired, all of data sets 350-356 would need to be decoded first using the second error correction code, and then row 300 could be decoded using the first error correction code. In contrast, if a systematic code were used for the second error correction code, row 300 could be decoded directly without first having to decode any of data sets 350-356. In some embodiments a systematic code is desirable because if the code is linear (which many codes, such as BCH, Reed Solomon, and LDPC codes, are), then there is little to no downside to using a systematic code. Furthermore, given that cases or likelihood of using the technique described herein is relatively rare, it may be desirable for the normal operation of reading a page to take precedence in the system design and for the normal operation not to be impacted (e.g., slowed down or made more complex) by the addition of this technique.

In some embodiments, the first error correction code and the second error correction code are selected so that they have relatively equal strengths. This may be desirable since if the codes are imbalanced (i.e., one code is much stronger than the other), the decoding will tend to be skewed in the direction of the stronger code. Put another way, decoding performance tends to be better when both codes are of relatively equal strengths. Although in an unconstrained system 2 weak codes may be used because they tend to turbo more effectively than a combination of 1 weak code and 1 strong code or 2 strong codes, it may be desirable to use some other combination of codes. In this example, CODEC 208 is used for normal operation, where a stronger may be preferred, so it may be desirable for this to take precedence over the performance during failure scenarios. As such, in some embodiments it may be desirable for a strong code to be used for CODEC 208 and a weak code for CODEC 212.

In some embodiments, the data associated with the rows (i.e., the A data sets) are located in the same (e.g., physical or logical) location on their respective NAND Flash chip. For example, each row may correspond to the first page in a particular chip such that the page addresses are the same (e.g., page address=1) but the chip addresses are different. The data associated with a row may not necessarily comprise all data in a NAND Flash chip. For example, one row may correspond to one page on a NAND Flash chip.

The following figures describe accessing or otherwise reading data stored in the format shown in FIG. 3. In most cases, the error correction capability of the first code is sufficient to correct random errors. However, in some cases the error correction capability of the first code is insufficient and turbo decoding using the second code is used.

Figure 4:
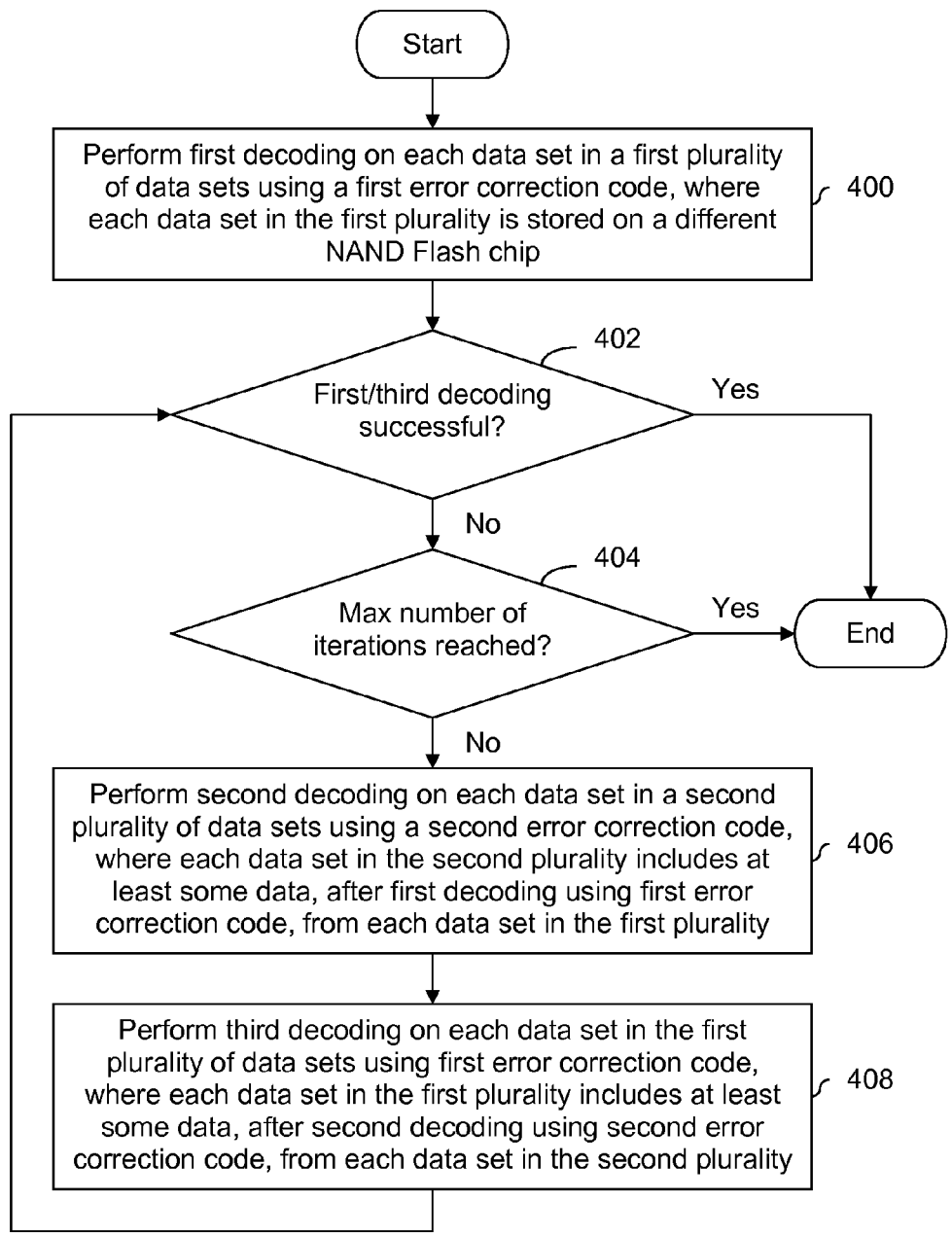
FIG. 4 is a flowchart illustrating an embodiment of a decoding process which uses a first error correction code and a second error correction code.

FIG. 4 is a flowchart illustrating an embodiment of a decoding process which uses a first error correction code and a second error correction code. In some embodiments, controller 204, CODEC 208 and CODEC 212 from FIG. 2 perform the exemplary process shown. At 400, a first decoding is performed on each data set in a first plurality of data sets using a first error correction code, where each data set in the first plurality is stored on a different NAND Flash chip. In FIG. 3, for example, rows 300-306 (i.e., the A data sets) are examples of a first plurality of data sets; rows 300-306 may be encoded using BCH code and a corresponding BCH decoder is used to decode those rows. In that example, decoding rows 300-306 corresponds to performing $N_p$ independent decoding attempts.

It is determined at 402 whether a first decoding is successful. For example, in FIG. 3 there are $N_p$ decoding attempts (corresponding to rows 300-306). Some codes are capable of detecting when the error correction capability of the code has been exceeded (e.g., the number of errors exceeds the maximum number of errors that particular code is capable of correcting). In some embodiments, if one of the (e.g., $N_p$) decoding attempts is determined to be unsuccessful (e.g., because the error correction capability of the first code has been exceeded) then it is determined that decoding is not successful. In some embodiments, some downstream process detects that the results from decoding at 400 or 408 is not successful.

If it is determined at 402 that decoding is successful (e.g., because all $N_p$ rows are properly decoded) then the process ends. For example, much of the time there will be relatively few errors and the error correction capability of the first code is sufficient to correct all of the errors present. However, in some cases there are too many errors and the error correction capability of the first code cannot correct all of the errors present. If it is determined at 402 that decoding is not successful, it is determined at 404 if a maximum number of iterations is reached. In this example, the system is configured to stop after a certain number of iterations is reached to prevent the system from performing an infinite number of attempts.

If a maximum number of iterations is reached at 404, then the process ends. Otherwise, at 406, a second decoding is performed on each of a plurality of second sets of data using a second error correction code, where each second set of data includes at least some data, after the first decoding using the first error correction code, from each first set of data. In FIG. 3, for example, B data sets are examples of a plurality of second sets of data and each data set includes at least some data from the A data sets, including corrections resulting from decoding using the first error correction code. With respect to a number of decoding attempts performed at step 406, in the example of FIG. 3, data sets 350-356 are decoding for a total of T decoding attempts.

After decoding at 406, at 408 a third decoding is performed on each data set in the first plurality of data sets using the first error correction code, where each data set in the first plurality includes at least some data, after the second decoding using the second error correction code, from each data set in the second plurality. For example, after decoding the B data sets in FIG. 3, the A data sets are decoded again. The various corrections performed may be sufficient so that this time decoding using the first error correction code is successful. After decoding at 408, it is determined at 402 whether the third decoding attempt is successful.

The following figures show a more detailed example of the exemplary decoding process described in FIG. 4.

Figure 5A:
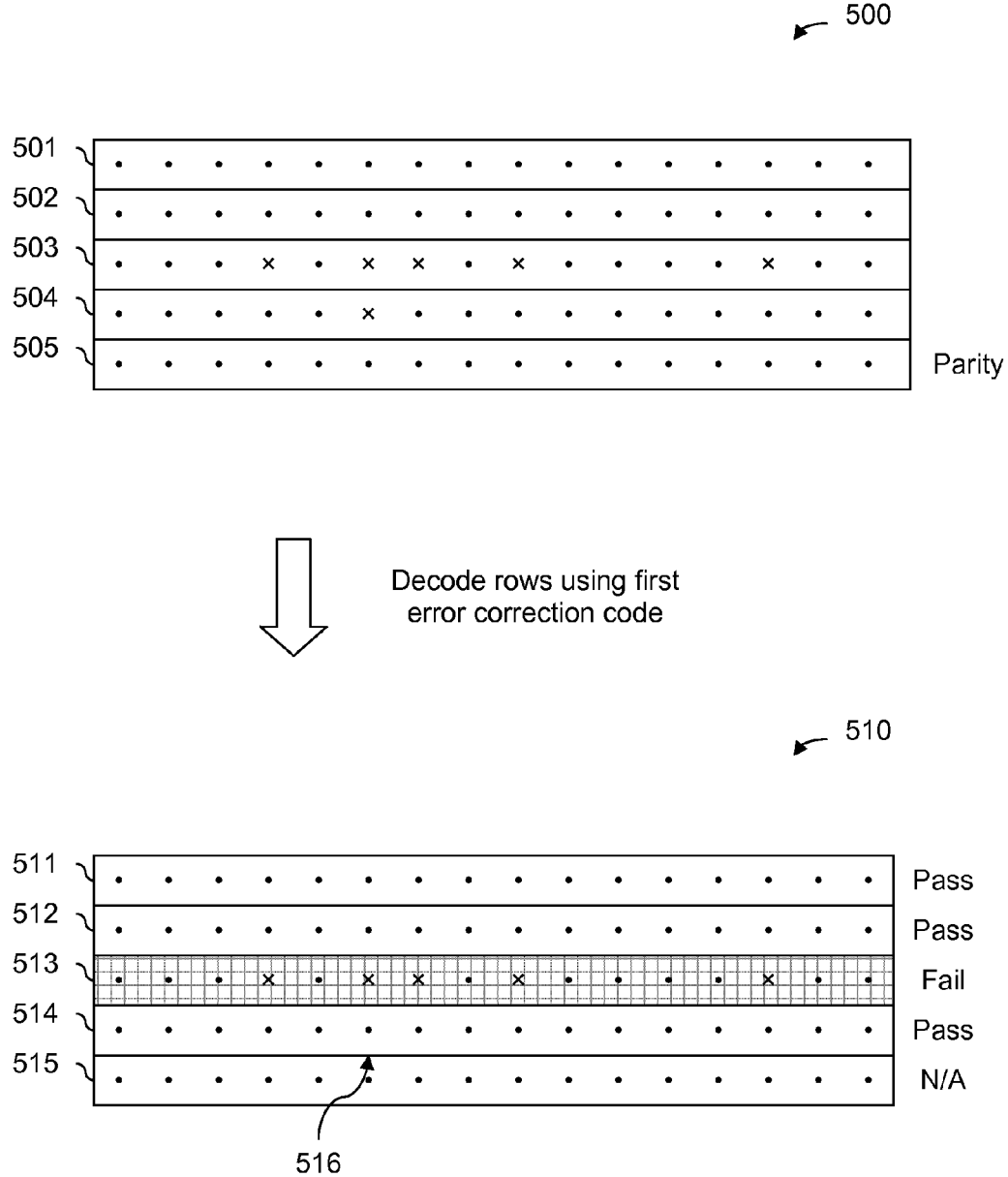
FIG. 5A is a diagram showing an embodiment of an initial decoding attempt performed on a first plurality of data sets using a first error correction code.

FIG. 5A is a diagram showing an embodiment of an initial decoding attempt performed on a first plurality of data sets using a first error correction code. In this figure and the following figures, symbols or bits which are errors are indicated by a "x" and symbols or bits which are correct are indicated by a "•" In the example shown, rows 501-504 are encoded using a first error correction code. Row 505 contains parity information associated with a second error correction code.

Rows 501-505 in diagram 500 are decoded using a first error correction code to obtain the results shown in diagram 510. Row 505 is not decoded because it is not encoded using the first error correction code. As shown in diagram 510, rows 511-512 and 514 have been successfully decoded and row 514 includes correction 516. However, row 513 has failed decoding (e.g., because that row contains too many errors and/or the locations of the errors are too close together). In some embodiments, no changes are made on row 513 because the decoding attempt failed and making a change may introduce even more noise or errors into the system.

Figure 5B:
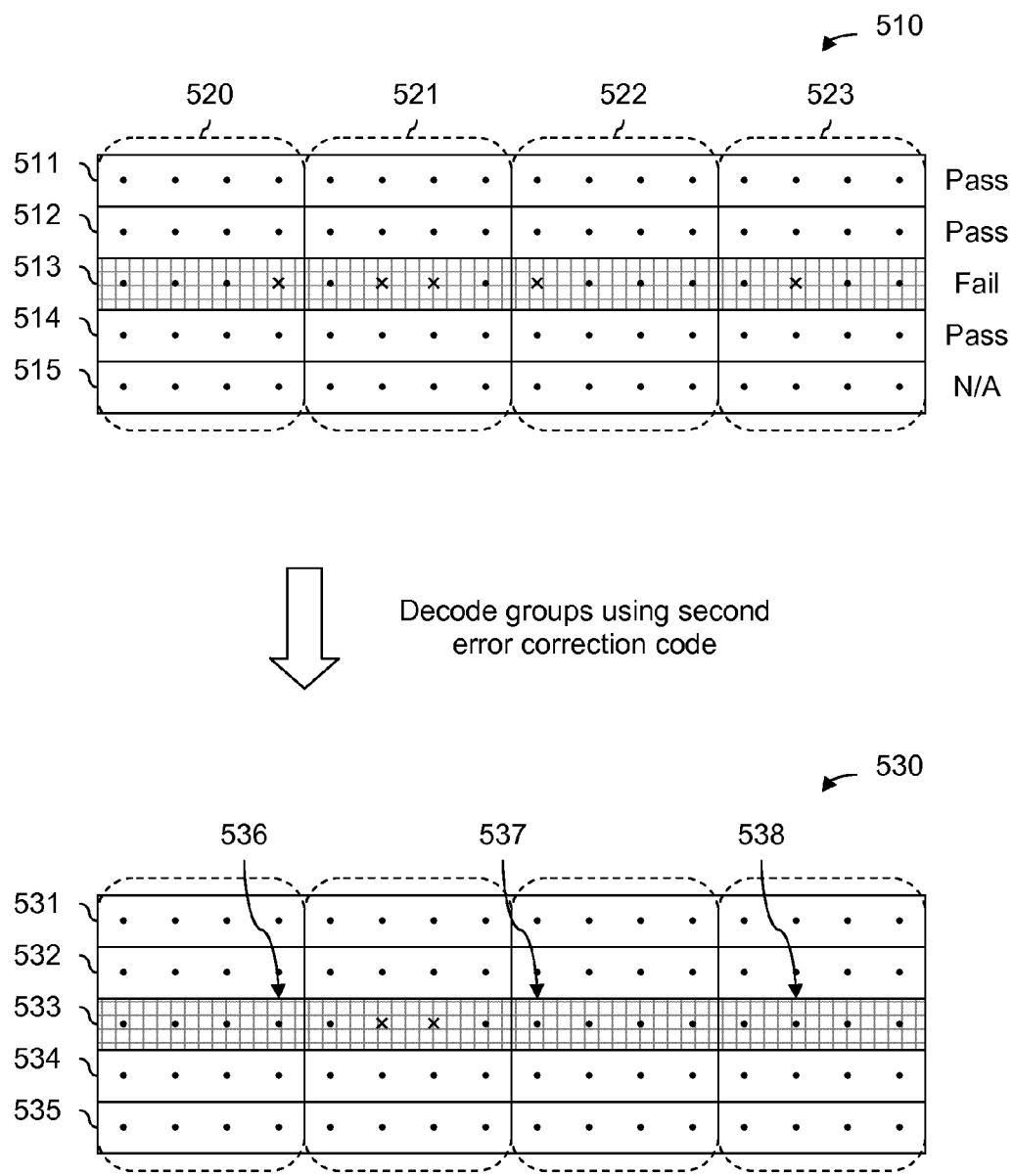
FIG. 5B is a diagram showing an embodiment of a decoding attempt performed on a second plurality of data sets using a second error correction code which occurs after an initial decoding attempt on a first plurality of data sets has is unsuccessful.

FIG. 5B is a diagram showing an embodiment of a decoding attempt performed on a second plurality of data sets using a second error correction code which occurs after an initial decoding attempt on a first plurality of data sets has is unsuccessful. For clarity, diagram 510 from FIG. 5A is repeated herein. Another decoding attempt is performed, this time using a second error correction code and using data sets 520-523. In this particular example, 4 (e.g., independent) decoding attempts are performed on data sets 520-523, respectively. Row 515 is used in this decoding attempt because it contains parity information related to the second error correction code.

Diagram 530 shows the results after decoding of the second plurality of data sets using the second error correction code. Of the 5 errors in row 513 in diagram 510, one is in group 520, two are in group 521, one is in group 522 and one is in group 523. This permits at least some of the errors (at least in this example) to be corrected using the second error correction code. For example, row 533 after decoding using the second error correction code includes corrections 536-538.

Figure 5C:
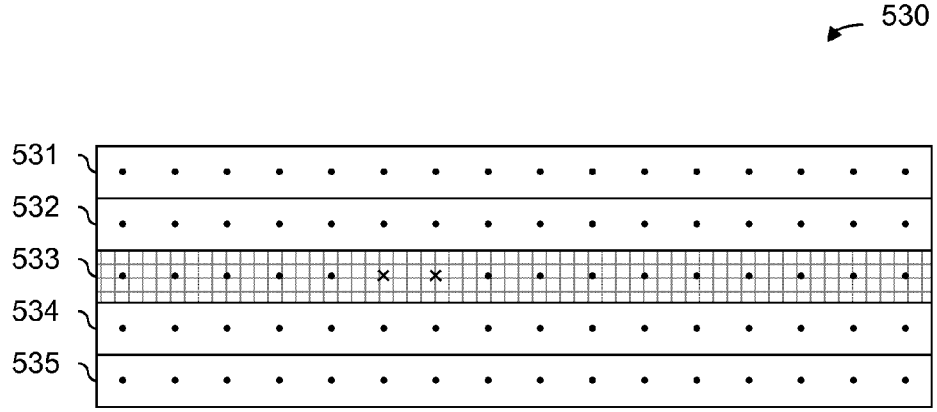
FIG. 5C is a diagram showing an embodiment of a successful decoding attempt performed on a first plurality of data sets using a first error correction code.
Figure 5C:
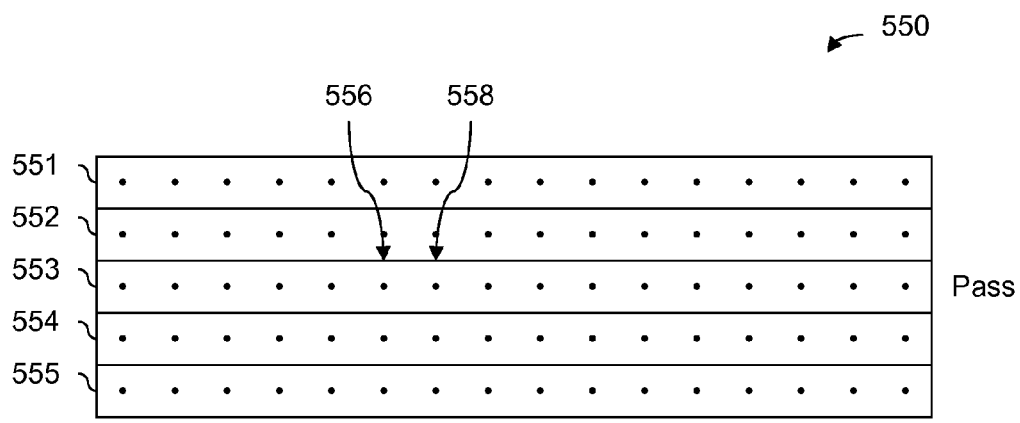

FIG. 5C is a diagram showing an embodiment of a successful decoding attempt performed on a first plurality of data sets using a first error correction code. In some embodiments, decoding is performed only on rows which have previously failed. For example, only row 533 may be decoded on this attempt and rows 521-522 and 524 may not necessarily be decoded. In some embodiments, a system only bothers to re-decode a page or codeword which has previously been successfully decoded, if it is suspected that those pages or codewords were incorrectly decoded. That is, that a mis-correction occurred where the code thought a page or code was successfully decoded when in fact it was not. In some embodiments, error detection codes (EDC) are included as an additional check ensure mis-corrections do not occur.

After the previous decoding attempts, only two errors remain in row 533 and the error correction capability of the first code is able to fix those errors. As shown in diagram 550, decoding of row 553 is successful and includes corrections 556 and 558.

In various embodiments, decoder is configured to input hard information or soft information. Hard information includes a decision without any corresponding confidence, likelihood or probability associated with that decision. For example, 0 and 1 are hard decisions. Soft decisions, on the other hand, include a probability to go along with a decision, indicating how sure or certain a decoder is in a particular decision. A log-likelihood ratio (LLR) is one such example where the sign (i.e., whether the LLR value is positive or negative) indicates the decision (e.g., 0 or 1) and the magnitude indicates a corresponding probability or certainty in that decision. In one example, an LLR of −15 indicates the decoder is 100% certain that it is a 1, an LLR of +15 indicates the decoder is 100% certain that it is a 0, and an LLR of 0 indicates the decoder has no decision (e.g., it is equally split between a 0 and 1 decision).

Corrections, such as corrections 536-538 in FIG. 5B, may be performed in a variety of ways to accommodate downstream decoders which are expecting hard or soft information. For example, if a decoder associated with a first error correction code is expecting a hard decision, corrections 536-538 in FIG. 5B may include changing a 1 to a 0 or vice versa, so that a subsequent decoder associated with a first error correction code (e.g., the decoding shown in subsequent FIG. 5C) properly receives hard information as an input. For a decoder expecting soft information, corrections may include saturating soft information. For example, corrections 536-538 in FIG. 5B may include setting the positive/negative sign of the affected LLR values to the appropriate sign and setting the magnitude to the largest value (e.g., in the above LLR example, the largest magnitude is 15).

Figure 6A:
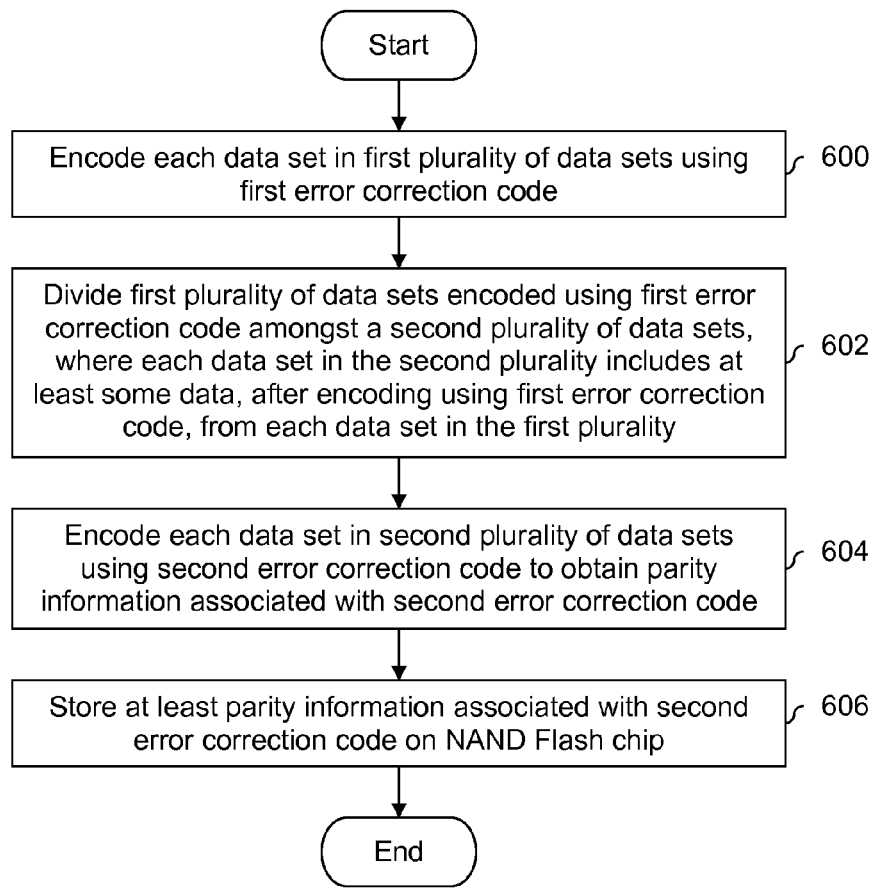
FIG. 6A is a flowchart illustrating an embodiment of a process for encoding data to be stored on one or more NAND Flash chips.

FIG. 6A is a flowchart illustrating an embodiment of a process for encoding data to be stored on one or more NAND Flash chips. At 600, each data set in a first plurality of data sets is encoded using a first error correction code. For example, in FIG. 2, host interface 202 may receive data to be encoded and stored in one or more NAND Flash chips. The amount of data received can be any amount. In FIG. 3, data sets A1-AN$_p$ are an example of a first plurality of data sets. In some embodiments (e.g., depending upon the amount of data received), one or more rows in the array shown in FIG. 3 are empty and are not encoded using a first error correction code.

At 602, a first plurality of data sets encoded using a first error correction code is divided amongst a second plurality of data sets, where each data set in the second plurality includes at least some data, after encoding using a first error correction code, from each data set in the first plurality. In FIG. 3 for example, data set B1 (350) includes information from data set A1 (after encoding using the first error correction code is performed), data set A2 (after encoding using the first error correction code is performed), etc. Data sets B1-BT in FIG. 3 are an example of a second plurality of data sets.

At 604, each data set in the second plurality of data sets is encoded using a second error correction code to obtain parity information associated with a second error correction code. For example, in FIG. 3 the parity information associated with row 308 is generated by encoding data sets B1-BT (e.g., independently or separately) using a second error correction code.

At 606, at least the parity information associated with the second error correction code is stored on a NAND Flash chip. For example, the parity information associated with row 308 in FIG. 3 is stored on NAND Flash chip N$_p$+1. In some embodiments, information in addition to the parity information is also stored at 606.

In various embodiments, the encoding steps described above may include one or more encoding sub-steps. The following figures describe various embodiments of such sub-steps.

Figure 6B:
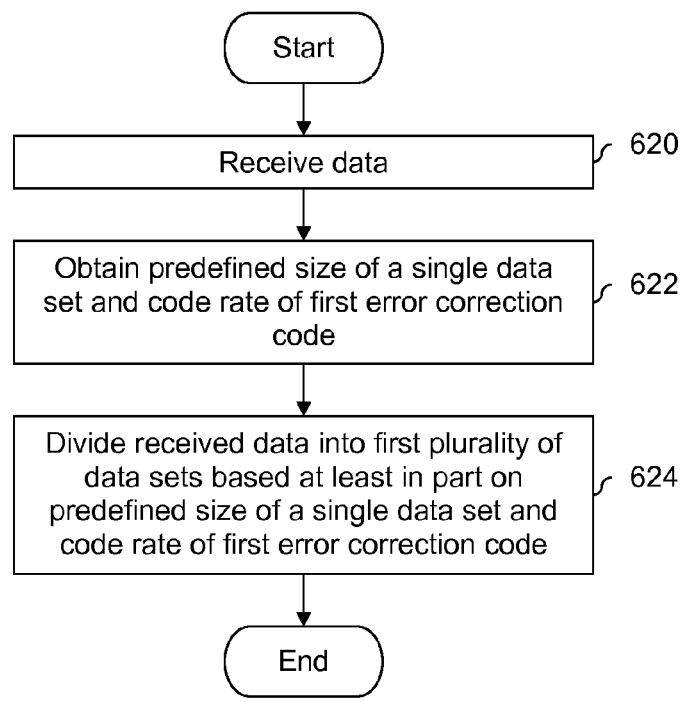
FIG. 6B is a flowchart describing an embodiment of a process for dividing received data into a first plurality of data sets.

FIG. 6B is a flowchart describing an embodiment of a process for dividing received data into a first plurality of data sets. In some embodiments, the process shown here precedes the process shown in FIG. 6A.

At 620, data is received. For example, host interface 202 in FIG. 2 may receive information (e.g., from an application, file system or operating system) to be stored on NAND Flash. Various amounts of data may be received.

A predefined size of a single data set is obtained at 622. For example, the size of one of the rows in FIG. 3 and the code rate of a first error correction code used to code one of the rows in FIG. 3. For example, if a code outputs n bits for every k bits input, then the code rate is k/n.

At 624, the received data is divided into a first plurality of data sets based at least in part on the predefined size of a single data set and code rate of first error correction code. In FIG. 3, for example, if each row is the size of a page, then the received information is divided such that after coding using the first error correction code (e.g., and the introduction of n-k bits for every k bits input), each encoded data set will fit into one page.

Figure 6C:
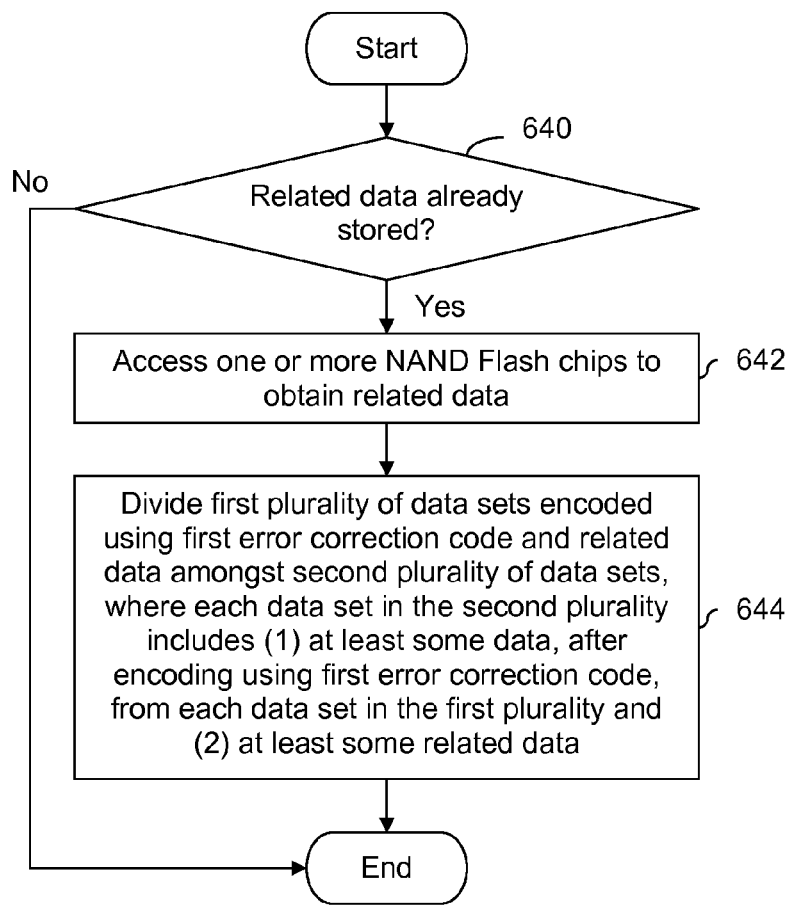
FIG. 6C is a flowchart describing an embodiment of a process for dividing a first plurality of data sets encoded using first error correction code amongst a second plurality of data sets.

FIG. 6C is a flowchart describing an embodiment of a process for dividing a first plurality of data sets encoded using first error correction code amongst a second plurality of data sets. In some embodiments, step 602 in FIG. 6A includes this exemplary process.

At 640, it is determined whether related data is already stored. For example, row 306 and some other rows may be empty such that the data array shown in FIG. 3 is only partially populated. If there is related data already stored, then one or more NAND Flash chips is accessed to obtain related data at 642. For example, those rows which are populated in a partially populated data array are retrieved from their respective NAND Flash chips. In some embodiments, parity information associated with a second error correction code is not necessarily obtained in this step (e.g., since it is not needed to perform subsequent encoding using a first and/or second error correction code).

At 644, a first plurality of data sets encoded using a first error correction code and the related data is divided amongst a second plurality of data sets, where each data set in the second plurality includes (1) at least some data, after encoding using a first error correction code, from each data set in the first plurality and (2) at least some related data. See for example data set B1 in FIG. 3: if data set A1 is received in a first batch and data set A2 is received in a second batch, then data set B1 includes some information from both data set A1 and data set A2.

Figure 6D:
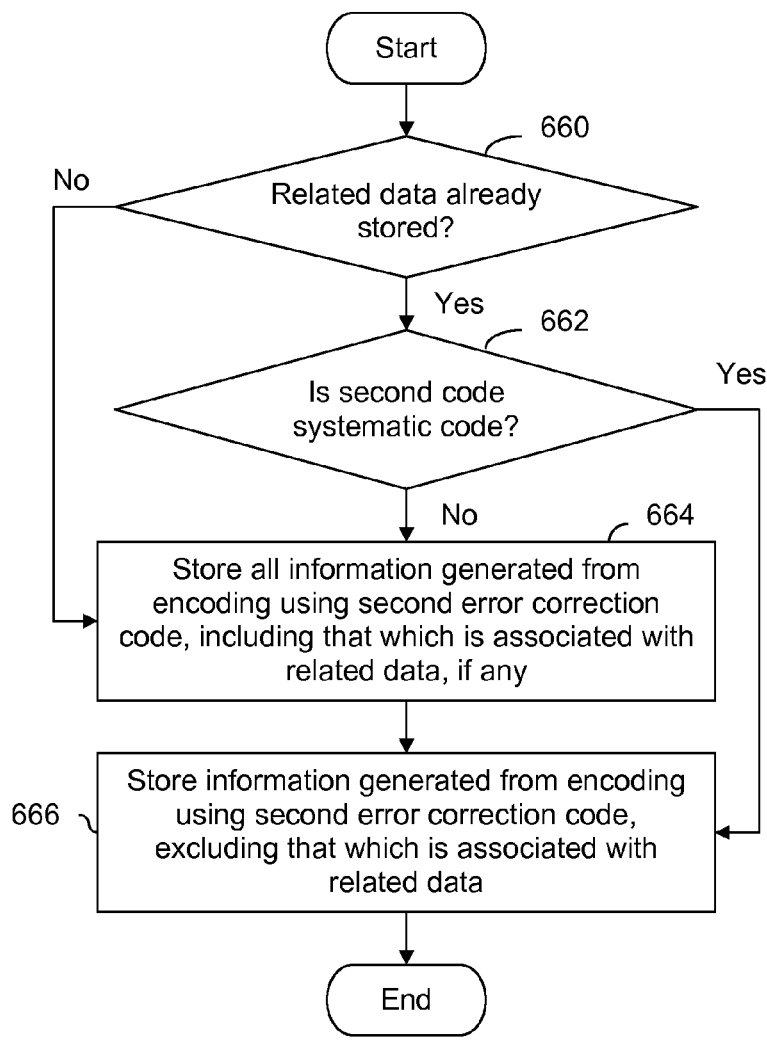
FIG. 6D is a flowchart describing an embodiment of a process for storing encoded information on one or more NAND Flash chips.

FIG. 6D is a flowchart describing an embodiment of a process for storing encoded information on one or more NAND Flash chips. In some embodiments, step 606 in FIG. 6A includes this exemplary process.

At 660, it is determined whether there is related data already stored. In some embodiments, the same logic used to perform step 640 in FIG. 6C is used here. If so, it is determined at 662 whether the second error correction code is a systematic code. If the second code is not a systematic code, or there is not related data already stored, then at 664 in a plurality of NAND Flash chips, all information generated from encoding using a second error correction code is stored, including that which is associated with related data, if any. In some cases, there is information already stored which does not need to be rewritten since it has not changed. This is not the case in step 644. In some cases, there is no previously stored information (e.g., the No path from step 660 to 664) or in other cases the previously stored information is no longer relevant and needs to be updated (e.g., the No path from step 662 to step 664).

If the second code is a systematic code at 662, then at 666 information generated from encoding using a second error correction code, excluding that which is associated with related data, is stored in a plurality of NAND Flash chips. Because of the systematic nature of the second error correction code, the previously stored information (excluding the parity information associated with the second error correction code) is still valid and does not need to be rewritten.

The following figure shows some example scenarios involving partially populated data arrays (e.g., as data arrives in batches).

Figure 7:
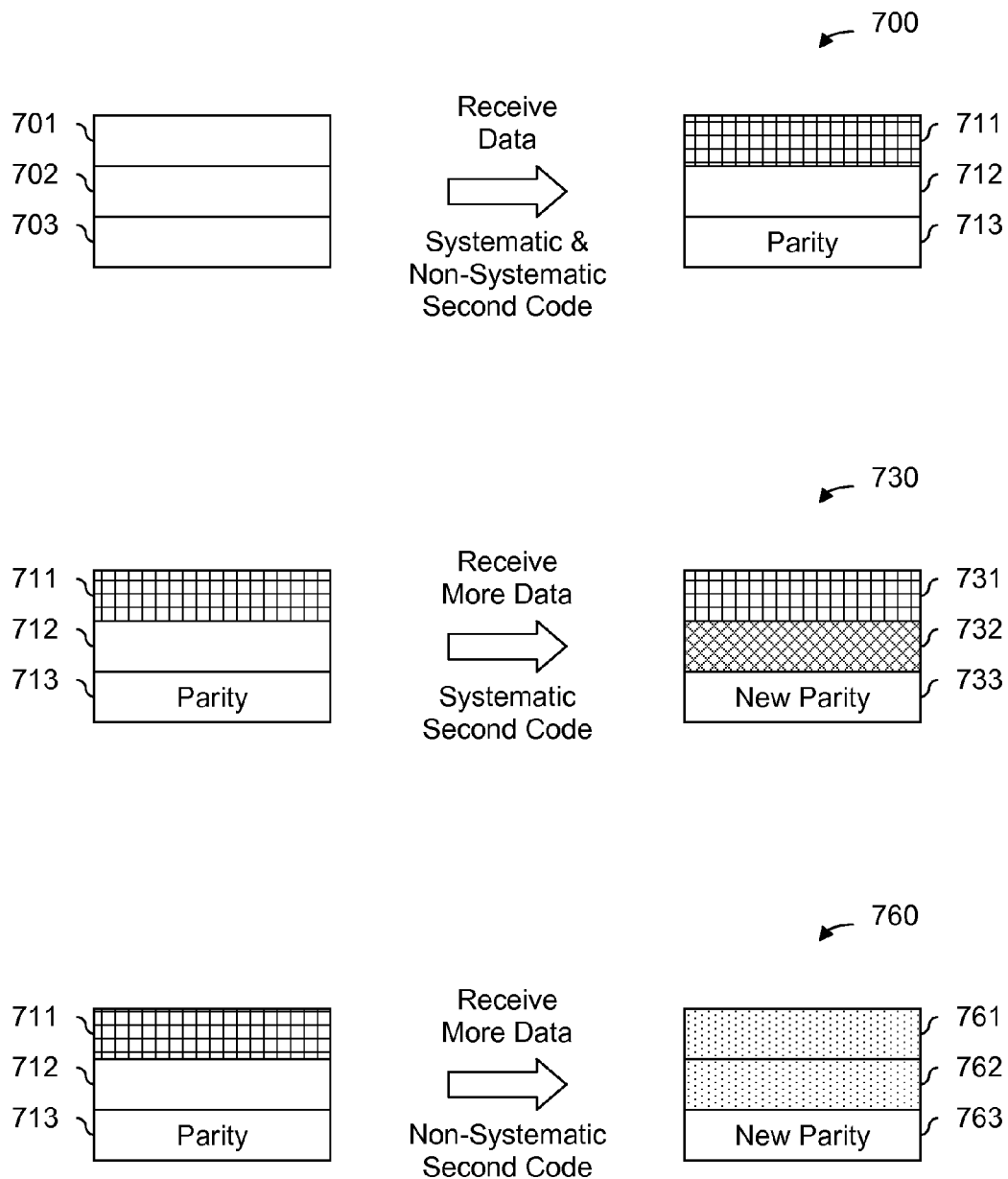
FIG. 7 is a diagram showing an embodiment of data to be stored arriving in batches, resulting in a partially populated data array.

FIG. 7 is a diagram showing an embodiment of data to be stored arriving in batches, resulting in a partially populated data array. In diagram 700, a data array (e.g., similar to that shown in FIG. 3) has three rows. Rows 701-703 show the state of the data array before the arrival of some data to be stored and rows 711-713 show the state of those same rows after encoding and storage. In this example, a second error correction code can either be systematic or non-systematic; in either case, rows 711 and 713 are populated and row 712 is not written to. For example, after encoding using the first error correction code, there may be one row's worth of data (e.g., corresponding to row 711). After encoding using the second error correction code, parity information associated with row 713 is generated. However, the amount of received data (after appropriate encoding) is not enough to fill row 712.

In some embodiments, encoding a second plurality of data sets (not shown) using a second error correction code includes using default or dummy values for empty rows (e.g., row 702/712). Some example default or dummy values include an 1's data vector, which corresponds to not writing at all (i.e., leaving the cells in an erased state). This may be desirable from an endurance standpoint (because the lifetime of a cell tends to go down with the number of operations performed on a cell), as well as a speed standpoint. In some embodiments, a controller may remember which rows are empty and what dummy values were used in order to aid in error correction decoding. In some embodiments, a controller manipulates hard or soft information to reflect the known values (e.g., by saturating soft information to the correction decision and the highest certainty).

In diagram 730, the second error correction code is a systematic code and more data to be stored is received. Since the second error correction code is a systematic code, the information contained in row 711 is still valid and does not necessarily need to be rewritten, although if desired it can be rewritten. Therefore, row 711 and 731 contain the same information. However, the parity information stored in 713 is obsolete and new parity information is stored in row 733. Row 732 includes the newly received information after encoding using the first error correction code. Since the second error correction code is a systematic code, row 732 is the same before and after encoding using the second error correction code.

In diagram 760, the second error correction code is non-systematic, meaning that the input data is not duplicated or repeated in the output codeword. As a result, the information stored in row 711 is obsolete and needs to be rewritten. As is shown in diagrams 730 and 760, the parity information needs to be updated for both systematic and non-systematic codes (see, e.g., rows 733 and 763).

In some embodiments, a data array (e.g., similar to that shown in FIG. 3) is organized in a manner to improve performance in environments where errors are unevenly distributed across NAND Flash storage. If errors occur more frequently in one type of data compared to another type of data, error correction codes work better if there is a mixture of the two groups as opposed to keeping the groups separate. The following figures describe such an embodiment.

Figure 8:
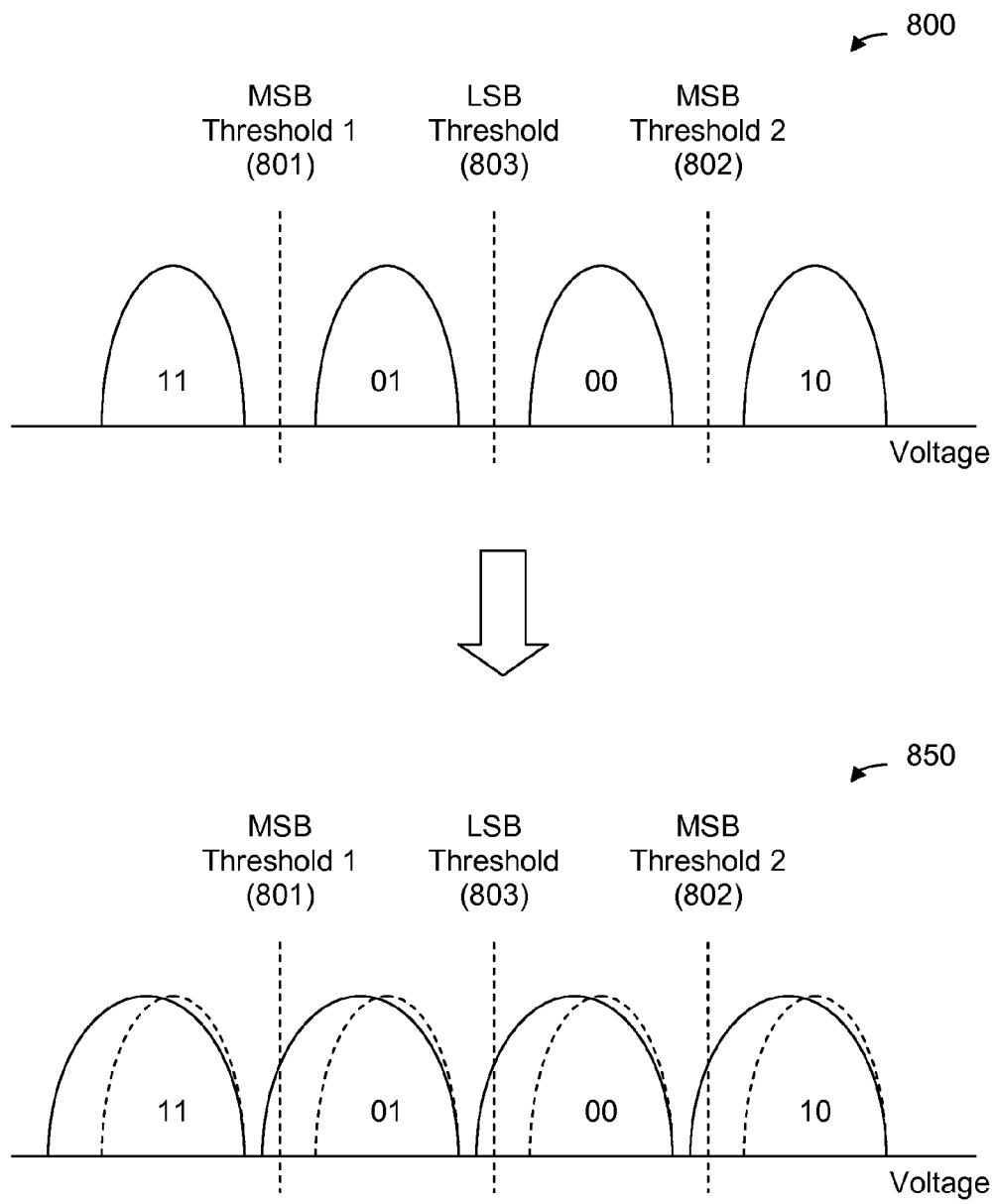
FIG. 8 is a diagram showing an embodiment of a multi-level cell (MLC) where multiple bits are stored in a single cell of a NAND Flash chip.

FIG. 8 is a diagram showing an embodiment of a multi-level cell (MLC) where multiple bits are stored in a single cell of a NAND Flash chip. In the example shown, diagram 800 shows a NAND Flash cell configured to store two bits of data per cell. This is an example of a multi-level cell (MLC) where two or more bits are stored (i.e., as one of $2^k$ voltage levels where k≥2), whereas a single-level cell (SLC) only stores a single bit of data (i.e., as one of 2 voltage levels). Depending upon the voltage level stored by a cell, different bit values are stored. From lowest to highest voltage level, the stored bit values (at least in this example) are 11, 01, 00 and 10. A voltage stored by a cell may be over a range of values, hence a histogram of voltage levels are shown in diagrams 800 and 850. In various embodiments, various numbers of bits and/or various bit mappings may be used.

To determine the LSB and MSB in this example, voltage thresholds are used. To determine the MSB, MSB thresholds 801 and 802 are used. For example, if the voltage is either below threshold 801 or is above threshold 802, then the MSB is a 1, otherwise the MSB is a 0. To determine the LSB, a single threshold (i.e., threshold 803) is used.

Over time the performance of a cell may degrade, resulting in the voltage histograms shown in diagram 850 (e.g., as a cell gets repeatedly erased, the semiconductor breaks down, resulting in charge leakage and loss of stored voltage). In diagram 850, the average voltage level has decreased and the variance (e.g., represented by the width of each curve) has increased. For comparison, the histograms associated with diagram 800 are shown as dashed lines in diagram 850.

This performance degradation in a cell may result in errors in de-mapping errors in the MSB and/or the LSB. Since there are two voltage levels associated with the MSB, the MSB tends to have more errors than the LSB (e.g., because with two thresholds there is more opportunity for things to go wrong). The following figure shows an embodiment of how data may be organized to improve performance in an environment where an MSB tends to have a higher error rate compared to an LSB.

Figure 9:
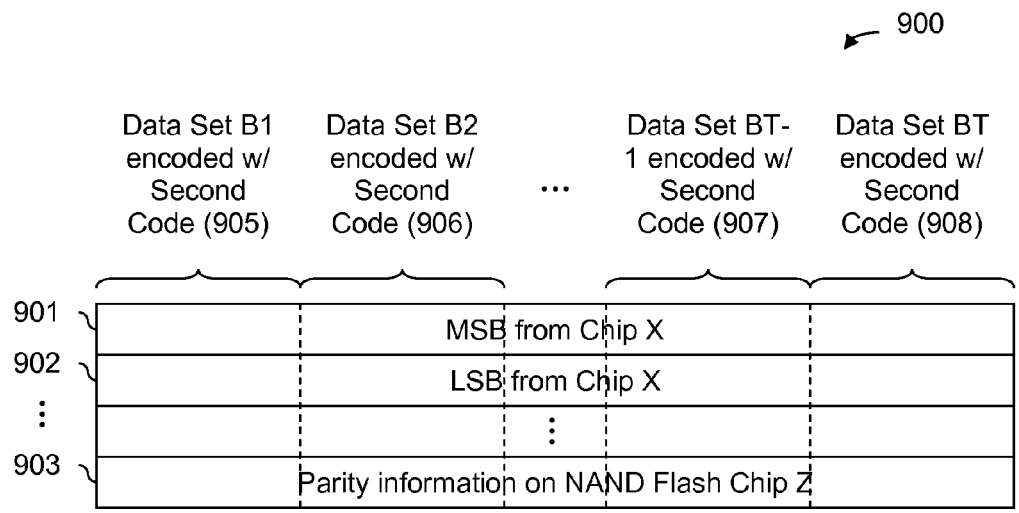
FIG. 9 is a diagram showing some embodiments of a second plurality of data sets which include MSBs and LSBs.
Figure 9:
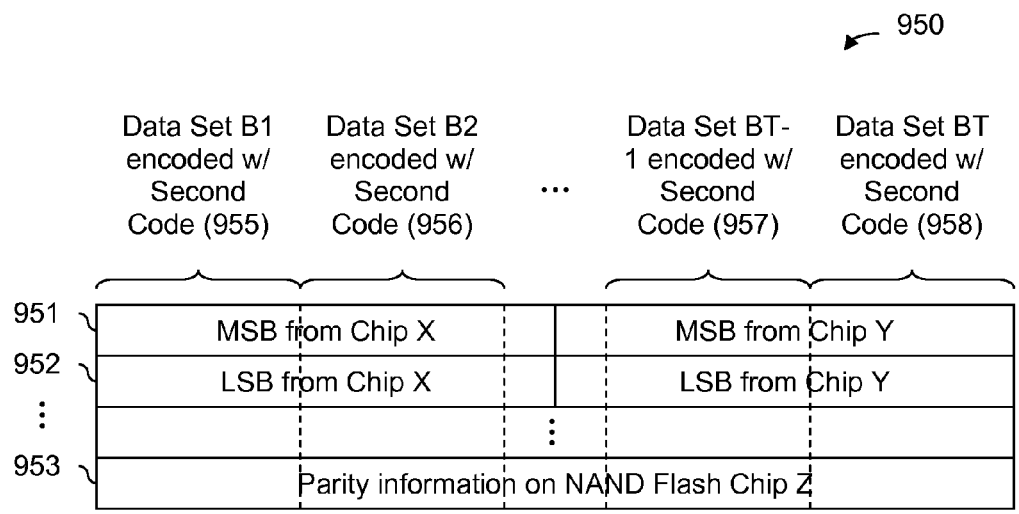

FIG. 9 is a diagram showing some embodiments of a second plurality of data sets which include MSBs and LSBs. In the example shown, each of the data sets in the B data sets includes some MSBs and as well some LSBs from chip X. In diagram 900, for example, row 901 includes MSB bits from chip X and row 902 includes LSB bits from the same chip. As a result, each of data sets B1-BT (905-908) includes some MSB bits and some LSB bits from that chip. Row 903 is used to store parity information, for example associated with a second error correction code.

Diagram 950 shows another embodiment where each data set in a second plurality of data sets includes both MSBs and LSBs. In this example, row 951 includes MSBs from two chips (i.e., chips X and Y) and row 952 includes LSBs from the same two chips. As a result of this arrangement, each of the B data sets (955-958) includes both MSBs and LSBs. Row 953 is used to store parity information associated with the second error correction code.

Figure 10:
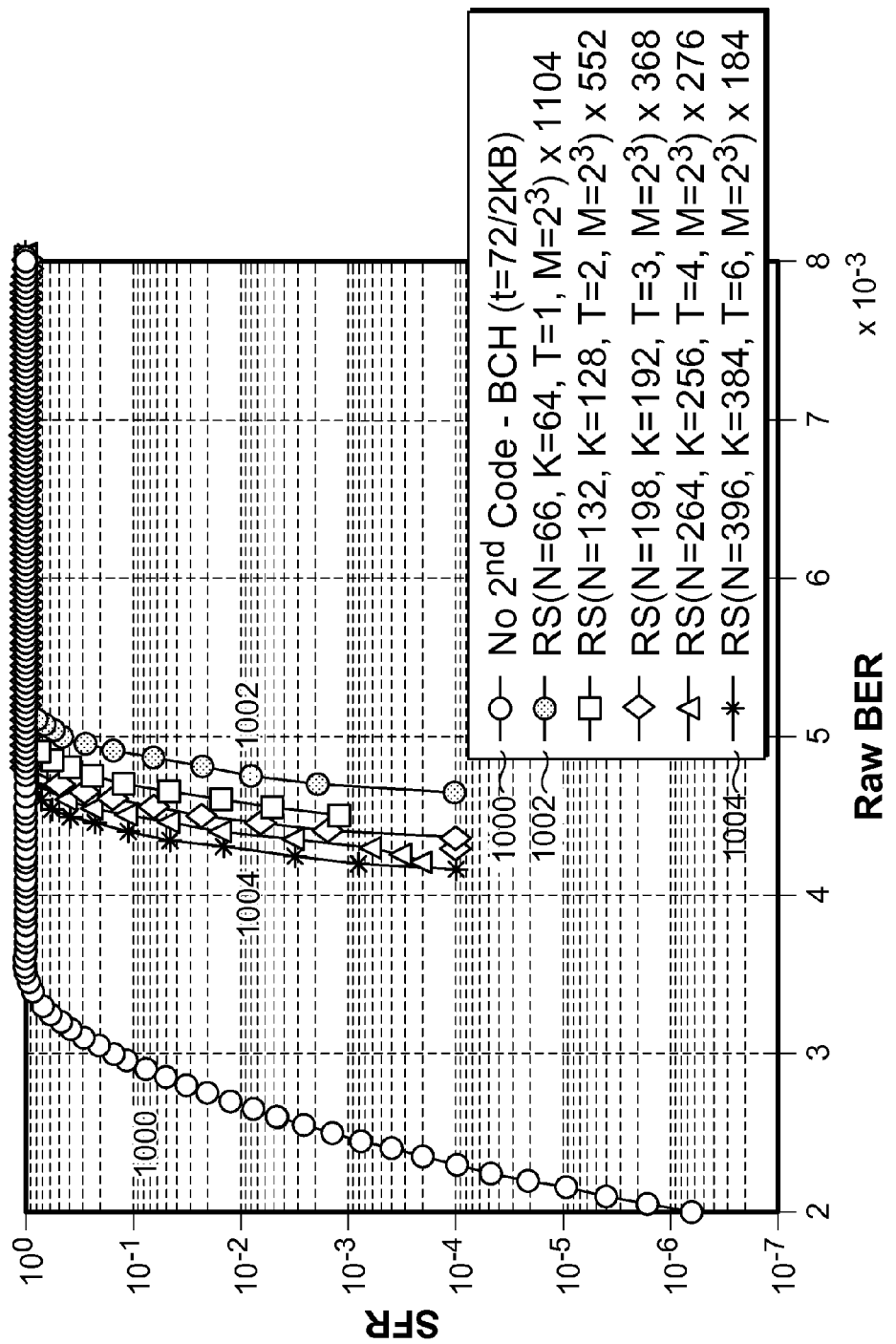
FIG. 10 is a diagram showing an embodiment of performance curves for various codes.

FIG. 10 is a diagram showing an embodiment of performance curves for various codes. In the example shown, the codes are associated with a second code, for example CODEC 212 in FIG. 2. As shown in this example, in some embodiments it may be desirable to use codes with shorter codeword lengths for a second code. As decoding may be able to proceed if any of the codes associated with a second CODEC (e.g., CODEC 212 in FIG. 2) successfully decode and thus correct a previously incorrect symbol or bit, having a greater number of codes may be preferable. Put another way, codes that have a shorter codeword length may be preferred over codes that are longer since there will be more "attempts" for a given amount of information and so a shorter codeword which results in (for example) 4 attempts may be better than using a longer codeword where everything is grouped in it which corresponds to a single attempt. Looking at this figure, for example, the shortest Reed-Solomon code (1002) outperforms the longest and strongest code (1004), due to the increased number of codes needed to encode the entire block, despite the fact that in isolation, the longer codes can correct more errors. As is also shown in this figure, using a second code is better than using no second code at all (1000).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for decoding, comprising:
   using a first decoder to perform a first decoding on each data set in a first plurality of data sets using a first error correction code, wherein:
      a first data set in the first plurality of data sets, processed during the first decoding, is obtained from a first NAND Flash chip; and
      a second data set in the first plurality of data sets, processed during the first decoding, is obtained from a second NAND Flash chip;
   determining if the first decoding is successful; and
   in the event it is determined that the first decoding is not successful:
      using a second decoder to perform a second decoding on each data set in a second plurality of data sets using a second error correction code, wherein:
         the second plurality of data sets processed during the second decoding includes one or more results from the first decoding using the first error correction code; and
         parity information, used by the second decoder to perform the second decoding, is obtained from a third NAND Flash chip; and
      using the first decoder to perform a third decoding on each data set in the first plurality of data sets using the first error correction code, wherein the first plurality of data sets processed during the third decoding includes one or more results from the second decoding using the second error correction code.

2. The method recited in claim 1, wherein the method is performed using one or more of the following: an application-specific integrated circuit (ASIC), a field-programmable gate array (FPGA) or a processor.

3. The method recited in claim 1, wherein the first error correction code includes one or more of the following: a Bose Ray-Chaudhuri (BCH) code or a low-density parity-check (LDPC) code.

4. The method recited in claim 1, wherein the second error correction code includes one or more of the following: a Reed-Solomon code or a systematic code.

5. The method recited in claim 1, wherein the strength of the first error correction code and the strength of the second error correction code are substantially the same.

6. The method recited in claim 1, wherein:
   the first data set in the first plurality of data sets includes most significant bits (MSBs);
   the second data set in the first plurality of data sets includes least significant bits (LSBs); and
   at least one data set in the second plurality of data sets includes both MSBs and LSBs.

7. The method recited in claim 1, wherein it is determined that decoding using the first error correction code is not successful in the event one or more errors in at least one of the data sets in the first plurality exceed(s) an error correction capability of the first error correction code.

8. The method recited in claim 1 further comprising: in the event it is determined that decoding using the first error correction code is not successful, determining if a maximum number of iterations is reached.

9. The method recited in claim 7, wherein in the event the maximum number of iterations is reached, (1) using the second decoder to perform the second decoding and (2) using the first decoder to perform the third decoding are not performed.

10. A system for decoding, comprising:
    a first decoder configured to:
       perform a first decoding on each data set in a first plurality of data sets using a first error correction code, wherein:
          a first data set in the first plurality of data sets, processed during the first decoding, is obtained from a first NAND Flash chip; and
          a second data set in the first plurality of data sets, processed during the first decoding, is obtained from a second NAND Flash chip; and
       in the event it is determined that the first decoding is not successful, perform a third decoding on each data set in the first plurality of data sets using the first error correction code, wherein the first plurality of data sets processed during the third decoding includes one or more results from a second decoding using a second error correction code;
    a controller configured to determine if the first decoding is successful; and
    a second decoder configured to: in the event it is determined that the first decoding is not successful, perform the second decoding on each data set in the second plurality of data sets using the second error correction code, wherein the second plurality of data sets processed during the second decoding includes one or more results from the first decoding using the first error correction code.

11. A method for encoding, comprising:
    using a first encoder to encode each data set in a first plurality of data sets using a first error correction code;

dividing the first plurality of data sets encoded using the first error correction code amongst a second plurality of data sets, wherein each data set in the second plurality includes at least some data, after encoding using the first error correction code, from each data set in the first plurality;

using a second encoder to encode each data set in the second plurality of data sets using a second error correction code to obtain parity information associated with the second error correction code;

storing a first data set, from the first plurality of data sets, on a first NAND Flash chip;

storing a second data set, from the first plurality of data sets, on a second NAND Flash chip; and storing at least the parity information associated with the second error correction code on a third NAND Flash chip.

12. The method recited in claim 11, wherein the method is performed using one or more of the following: an application-specific integrated circuit (ASIC), a field-programmable gate array (FPGA) or a processor.

13. The method recited in claim 11, wherein the first error correction code includes one or more of the following: a Bose Ray-Chaudhuri (BCH) code or a low-density parity-check (LDPC) code.

14. The method recited in claim 11, wherein the second error correction code includes one or more of the following: a Reed-Solomon code or a systematic code.

15. The method recited in claim 11, wherein the strength of the first error correction code and the strength of the second error correction code are substantially the same.

16. The method recited in claim 11, wherein:
the first data set in the first plurality of data sets includes most significant bits (MSBs);
the second data set in the first plurality of data sets includes least significant bits (LSBs); and
at least one data set in the second plurality of data sets includes both MSBs and LSBs.

17. The method recited in claim 11 further comprising, prior to using the first encoder to encode each data set in the first plurality of data sets using the first error correction code:
receiving data;
obtaining a predefined size of a single data set and a code rate associated with the first error correction code; and
dividing the received data into the first plurality of data sets based at least in part on the predefined size of a single data set and the code rate associated with the first error correction code.

18. The method recited in claim 11, wherein dividing the first plurality of data sets includes:

accessing one or more NAND Flash chips to obtain related data; and dividing (1) the first plurality of data sets encoded using the first error correction code and (2) the related data amongst the second plurality of data sets, wherein each data set in the second plurality includes (1) at least some data, after encoding using the first error correction code, from each data set in the first plurality and (2) at least some related data.

19. The method recited in claim 11, wherein storing at least the parity information includes:
determining whether related data is already stored; and
in the event it is determined that related data is not already stored, storing all information generated from the encoding using the second error correction code.

20. The method recited in claim 19, wherein storing at least the parity information further includes:
in the event it is determined that related data is already stored, determining whether the second code is a systematic code; and
in the event it is determined that the second code is a systematic code, storing information generated from the encoding using the second error correction code, excluding that which is associated with the related data.

21. The method recited in claim 20, wherein storing at least the parity information further includes in the event it is determined that the second code is not a systematic code, storing all information generated from the encoding using the second error correction code, including that which is associated with the related data.

22. A system for encoding, comprising:
a first encoder configured to encode each data set in a first plurality of data sets using a first error correction code;
a processor configured to divide the first plurality of data sets encoded using the first error correction code amongst a second plurality of data sets, wherein each data set in the second plurality includes at least some data, after encoding using the first error correction code, from each data set in the first plurality;
a second encoder configured to encode each data set in the second plurality of data sets using a second error correction code to obtain parity information associated with the second error correction code; and
an interface configured to:
store a first data set, from the first plurality of data sets, on a first NAND Flash chip;
store a second data set, from the first plurality of data sets, on a second NAND Flash chip; and
store at least the parity information associated with the second error correction code on a NAND Flash chip.

* * * * *